United States Patent
Kono

(10) Patent No.: US 11,099,488 B2
(45) Date of Patent: Aug. 24, 2021

(54) EXPOSURE APPARATUS AND ARTICLE MANUFACTURING METHOD

(71) Applicant: CANON KABUSHIKI KAISHA, Tokyo (JP)

(72) Inventor: Michio Kono, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/854,152

(22) Filed: Apr. 21, 2020

(65) Prior Publication Data
US 2020/0249583 A1    Aug. 6, 2020

Related U.S. Application Data

(63) Continuation of application No. PCT/JP2018/038417, filed on Oct. 16, 2018.

(30) Foreign Application Priority Data

Oct. 24, 2017    (JP) .............................. JP2017-205645
Aug. 2, 2018    (JP) .............................. JP2018-146250

(51) Int. Cl.
*G03F 7/20*    (2006.01)
(52) U.S. Cl.
CPC ................................ *G03F 7/70641* (2013.01)
(58) Field of Classification Search
CPC .................................................. G03F 7/70641
See application file for complete search history.

(56) References Cited

U.S. PATENT DOCUMENTS

| 5,117,254 A * | 5/1992 | Kawashima ......... G03F 9/7026 355/43 |
| 5,864,433 A * | 1/1999 | Takahashi ......... G02B 27/0025 250/548 |
| 2009/0021708 A1 | 1/2009 | Boxmeer et al. |
| 2009/0323040 A1 | 12/2009 | Cornell et al. |
| 2012/0133915 A1 | 5/2012 | Matsuyama et al. |

(Continued)

FOREIGN PATENT DOCUMENTS

| JP | H05-119468 A | 5/1993 |
| JP | H05-297262 A | 11/1993 |

(Continued)

*Primary Examiner* — Steven Whitesell Gordon
(74) *Attorney, Agent, or Firm* — Canon U.S.A., Inc. IP Division

(57) ABSTRACT

An exposure apparatus according to the present invention includes a projection optical system projecting, onto a substrate, exposure light for forming a pattern on the substrate, a light shielding member having an opening for allowing the exposure light to pass therethrough, a focus detecting unit detecting a defocus amount representing a positional deviation between a condensed position of the exposure light and the substrate, a light receiving element receiving a light flux passing through the opening in the light shielding member after being reflected by the substrate, and a control unit moving the light shielding member in a direction of an optical axis of the projection optical system on the basis of a result of detection in the focus detecting unit. The focus detecting unit detects the defocus amount on the basis of the amount of light received by the light receiving element.

12 Claims, 5 Drawing Sheets

(56) References Cited

U.S. PATENT DOCUMENTS

2014/0049763 A1    2/2014  Miyakawa
2017/0357163 A1   12/2017  Miyakawa

FOREIGN PATENT DOCUMENTS

| | | |
|---|---|---|
| JP | H09-270382 A   | 10/1997 |
| JP | H10-253327 A   |  9/1998 |
| JP | 2000-173112 A  |  6/2000 |
| JP | 2002-222753 A  |  8/2002 |
| JP | 2004-62155 A   |  2/2004 |
| JP | 2006-60152 A   |  3/2006 |
| JP | 2007-294550 A  | 11/2007 |
| JP | 2009-86641 A   |  4/2009 |
| JP | 2011-2512 A    |  1/2011 |
| JP | 2011-7941 A    |  1/2011 |
| JP | 2011-527024 A  | 10/2011 |
| JP | 2015-172750 A  | 10/2015 |
| JP | 2017-10061 A   |  1/2017 |
| JP | 2017-83676 A   |  5/2017 |
| WO | 2017/170514 A1 | 10/2017 |

\* cited by examiner

EXPOSURE APPARATUS AND ARTICLE MANUFACTURING METHOD

CROSS-REFERENCE TO RELATED APPLICATIONS

This application is a Continuation of International Patent Application No. PCT/JP2018/038417, filed Oct. 16, 2018, which claims the benefit of Japanese Patent Application No. 2017-205645, filed Oct. 24, 2017, and Japanese Patent Application No. 2018-146250, filed Aug. 2, 2018, all of which are hereby incorporated by reference herein in their entirety.

BACKGROUND OF THE INVENTION

Field of the Invention

The present invention relates to an exposure apparatus and an article manufacturing method using the same.

Description of the Related Art

Exposure apparatuses are known, by which a pattern on an original (mask) is transferred through a projection optical system onto a photosensitive substrate. In recent years, substrates exposed by such exposure apparatuses have become larger and, accordingly, masks having patterns thereon have become larger. As the masks become larger, both the cost of the masks themselves and the time required to manufacture the masks increase. This leads to higher costs of manufacturing the masks.

As a solution to this, so-called maskless exposure apparatuses are attracting attention, which are capable of forming a pattern on a substrate without using a mask having a pattern thereon. Maskless exposure apparatus is a digital exposure apparatus that uses an optical modulator, such as a digital micromirror device (DMD). In the maskless exposure apparatus, the DMD generates exposure light corresponding to an exposure pattern, exposes pattern data corresponding to the exposure pattern on a substrate, and thus forms the pattern on the substrate without using a mask.

Japanese Patent Application Laid-Open No. 2004-62155 discloses a maskless exposure apparatus in which laser beams emitted from laser emission portions enter optical modulation elements, and exposure elements modulate the laser beams into either an exposing state or a non-exposing state to perform image exposure based on image data.

In the maskless exposure apparatus, the intensity distribution of spot light on the substrate has a significant impact on pattern resolution performance. If the condensed position of spot light deviates in a direction perpendicular to the substrate, the resulting variation in the intensity distribution of spot light on the substrate may lead to degradation of pattern resolution performance. The pattern resolution performance is improved by focus control which reduces defocus representing a positional deviation between the condensed position of spot light and the substrate surface.

Japanese Patent Application Laid-Open No. 2011-2512 discloses a focus control method that uses an image processing sensor for detecting defocus. The image processing sensor is disposed on a holding member that holds a substrate. In focus control, light reflected by an optical modulator and transmitted through a projection optical system is imaged on the image processing sensor, and the angle of the light beam reflected by the optical modulator is adjusted in such a manner as to increase the contrast of the optical image formed on the image processing sensor.

With the focus control method disclosed in Japanese Patent Application Laid-Open No. 2011-2512, it is possible to perform focus control on defocus relative to a held surface of the substrate. It is difficult, however, to perform focus control on defocus relative to the substrate where pattern formation actually takes place. With the focus control method disclosed in Japanese Patent Application Laid-Open No. 2011-2512, therefore, it may be difficult to sufficiently improve focus accuracy. Also, since it takes a relatively long time to perform focus control based on the contrast of the optical image, it is difficult to achieve high-speed focus control.

An object of the present invention is to provide an exposure apparatus that is capable of performing focus control on a substrate at high speed.

SUMMARY OF THE INVENTION

An exposure apparatus according to the present invention includes a projection optical system configured to project, onto a substrate, exposure light for forming a pattern on the substrate, a light shielding member having an opening for allowing the exposure light to pass therethrough, a focus detecting unit configured to detect a defocus amount representing a positional deviation between a condensed position of the exposure light and the substrate, a light receiving element configured to receive a light flux passing through the opening in the light shielding member after being reflected by the substrate, and a control unit configured to move the light shielding member in a direction of an optical axis of the projection optical system on the basis of a result of detection in the focus detecting unit. The focus detecting unit detects the defocus amount on the basis of the amount of light received by the light receiving element.

Further features of the present invention will become apparent from the following description of exemplary embodiments with reference to the attached drawings.

DESCRIPTION OF THE EMBODIMENTS

Embodiments of the present invention will now be described in detail with reference to the drawings. The present invention is not limited to the embodiments described herein, which are merely illustrative of the present invention. An exposure apparatus of the present invention is suitable for use as a so-called maskless exposure apparatus that is capable of forming a pattern on a substrate without using a mask having a pattern thereon. The exposure apparatus of the present invention may also be used as an exposure apparatus that forms a pattern on a substrate using a mask having a pattern thereon.

First Embodiment

Figure 1:
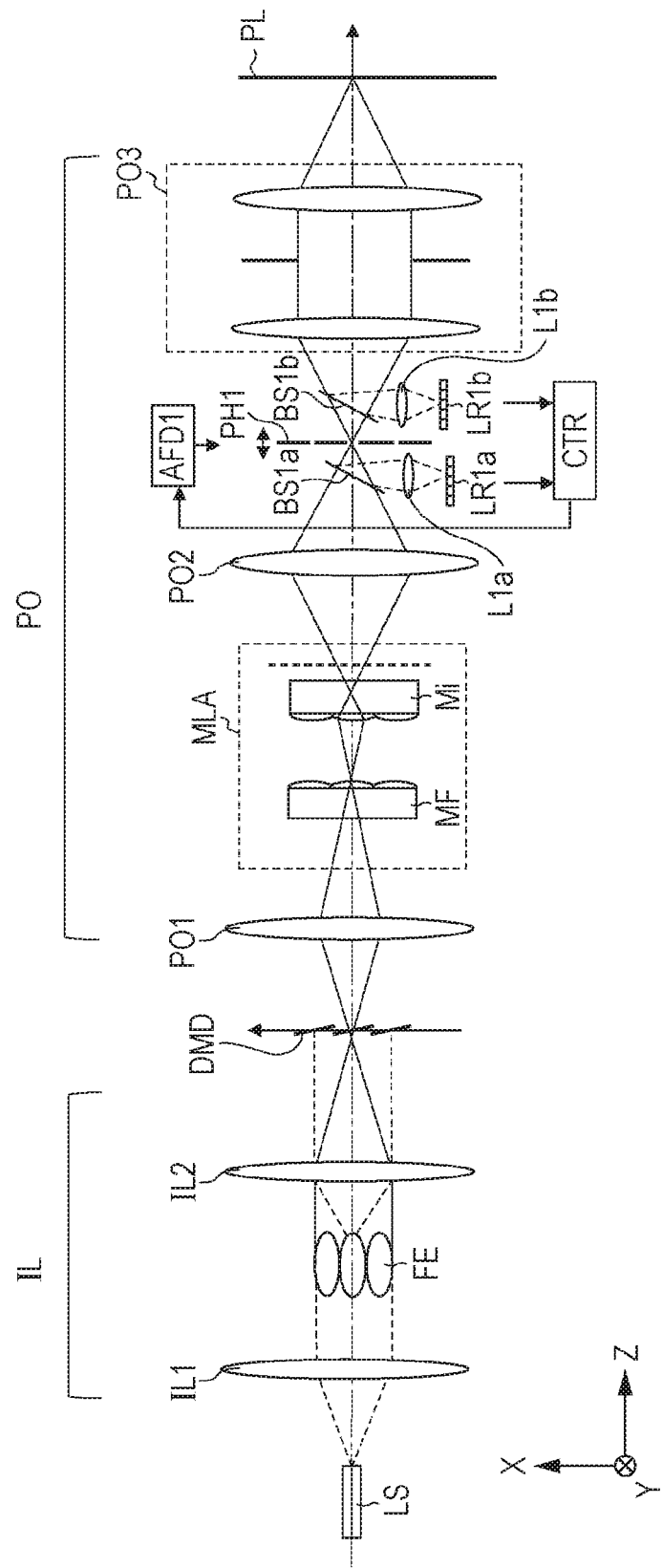
FIG. 1 is a diagram illustrating a configuration of optical systems according to a first embodiment.

With reference to FIG. 1, a configuration of an exposure apparatus including an illumination optical system IL and a projection optical system PO, according to the present embodiment, will be described.

In the present embodiment, by detecting the amount of light flux reflected by a substrate PL and passing through a pinhole member included in the projection optical system PO, a defocus amount representing a positional deviation between the condensed position of spot light and the surface of the substrate PL is detected. Focus control for changing the detected defocus amount is performed by moving the pinhole member, which serves as a light shielding member.

In the exposure apparatus of a so-called maskless type according to the present embodiment, a light flux emitted from the illumination optical system IL enters a digital micromirror device (hereinafter referred to as DMD) serving as an optical modulation unit, which is an optical modulator. Then, exposure light corresponding to an exposure pattern is generated by the DMD and condensed through the projection optical system PO onto the substrate PL, so that pattern data corresponding to the exposure pattern is exposed on the substrate.

As a light source LS, for example, a semiconductor laser or a light emitting diode (LED) is used. The wavelength of the light source depends on the type of a photosensitive resist applied onto the substrate PL. The wavelength of the light source LS typically ranges from about 300 nm to 440 nm.

The configuration of the illumination optical system IL will now be described. A light flux emitted from the light source LS is collimated by an optical system IL1 and illuminates a fly-eye lens FE.

The fly-eye lens FE illustrated in FIG. 1 includes nine lens cells arranged in an XY plane containing the X-axis and the Y-axis that are perpendicular to the optical axis (Z-axis) of the illumination optical system IL. The nine lens cells are arranged in three rows in both the X-axis direction and the Y-axis direction. The number of lens cells of the fly-eye lens FE may be changed as appropriate.

The light flux with which the fly-eye lens FE substantially uniformly illuminates an optical system IL2 is imaged, by the action of the optical system IL2, on micromirrors which serve as optical modulation elements of the DMD. Although the light flux entering the DMD is illustrated as being transmitted through the DMD in FIG. 1, the light flux entering the DMD is actually reflected by the reflecting surface of each micromirror of the DMD.

The micromirrors of the DMD are two-dimensionally arranged, and the angles of the reflecting surfaces of the micromirrors can be changed individually. This enables modulation of light illuminating each mirror into either an exposing state or a non-exposing state.

The configuration of the projection optical system PO will now be described. The light flux reflected by the micromirrors of the DMD enters an optical system PO1 of the projection optical system PO. The optical system PO1 has the function of condensing the light flux entering the optical system PO1 on a microlens array MLA. The microlens array MLA includes a field lens MF and an imaging lens Mi spaced from the field lens MF by the focal length of the field lens MF.

The light flux imaged on the field lens MF by the optical system PO1 is re-imaged by the imaging lens Mi. In the present embodiment, the point (re-imaging point) where an image is formed by the imaging lens Mi is located inside the imaging lens Mi. By an optical system PO2, the light flux from the re-imaging point is re-imaged at another imaging position, where a pinhole member PH1 having a plurality of openings is disposed. The pinhole member PH1 is disposed in the optical path of the projection optical system PO, and the openings in the pinhole member PH1 correspond to the respective positions of the micromirrors of the DMD. The spot light reduced in diameter by the pinhole member PH1 is transmitted through an optical system PO3 to illuminate onto the substrate PL.

The pinhole member PH1 is made of, for example, metal. Since metal has high optical reflectivity, the light shielding performance of the pinhole member PH1 is enhanced by using a metal to form the pinhole member PH1. The pinhole member PH1 may be coated with a dielectric film.

A description will now be given of how, by using the pinhole member and a light receiving element (described below), a defocus amount detecting method and a focus control method for changing the defocus amount are performed.

First, the defocus amount detecting method using the pinhole member and the light receiving element will be described. In the present embodiment, a beam splitter BS1a, which serves as a reflecting member, is disposed between the optical system PO2 and the pinhole member PH1 that are included in the projection optical system PO. A light flux reflected by the beam splitter BS1a is imaged on a light receiving element LR1a by an imaging lens Lia.

As described above, the spot light passing through the pinhole member PH1 is transmitted through the optical system P03 and condensed onto the substrate PL. The spot light condensed on the substrate PL is partially reflected by the substrate PL and passes through the optical system P03 and openings in the pinhole member PH1 to enter the beam splitter BS1a. The light entering the beam splitter BS1a is partially reflected by the beam splitter BS1a and imaged on the light receiving element LR1a by the imaging lens L1a.

In the present embodiment, a defocus amount representing a positional deviation between the condensed position of spot light and the surface of the substrate PL is estimated on the basis of the amount of light received by the light receiving element LR1a. The pinhole member PH1 is disposed in a plane optically conjugate to the surface of the substrate PL. In an in-focus state where the defocus amount is smaller than a predetermined amount, the light amount detected by the light receiving element LR1a is largest. In an out-of-focus state where the defocus amount is greater than or equal to the predetermined amount, the light flux passing through the pinhole member PH1 is partially vignetted and this reduces the amount of light received by the light receiving element LR1a.

A defocus amount is estimated by using, as a reference value, the maximum light amount detected by the light receiving element LR1a in the in-focus state. Specifically, by determining in advance a relation between the light amount detected by the light receiving element LR1a and the defocus amount, the defocus amount can be estimated from the light amount detected by the light receiving element LR1a. For example, by storing the relation described above in a control unit CTR and inputting the light amount detected by the light receiving element LR1a into the control unit CTR, the control unit CTR functions as a defocus detecting unit that detects the defocus amount. The control unit CTR can also perform focus control for reducing the defocus amount.

Next, the focus control method will be described in detail. In the present invention, focus control is performed by moving the pinhole member PH1 in the direction of the optical axis of the projection optical system PO. Specifically, the pinhole member PH1 is moved in the direction in which the light amount detected by the light receiving element LR1a increases. The moving amount of the pinhole member PH1 is determined, for example, by the defocus amount estimated by the method described above and the focal length of the optical system PO3.

The pinhole member PH1 is driven by an actuator AFD1. The moving amount of the pinhole member PH1 is sent from the control unit CTR and input to the actuator AFD1.

As described above, in the present embodiment, focus control is performed on the basis of the light amount detected by the light receiving element LR1a. Since the light amount is detected by the light receiving element LR1a in a relatively short time, high-speed focus control is achieved by performing the focus control according to the present embodiment. The light amount detected by the light receiving element LR1a is obtained by directly detecting the light flux reflected in an exposure region on the substrate PL. Therefore, by performing focus control on the basis of the light amount detected by the light receiving element LR1a, the accuracy of focus control is improved.

In the present embodiment, where focus control is performed by driving the pinhole member PH1 which is relatively lightweight, it is easy to achieve high-speed focus control. Since the pinhole member PH1 is used to detect the defocus amount, perform focus control, and reduce the diameter of spot light, the configuration of the entire exposure apparatus is simplified.

The present embodiment assumes using the light receiving element LRla in which a plurality of light receiving portions are two-dimensionally arranged. The light receiving portions of the light receiving element LRla each correspond to one opening in the pinhole member PH1 and one micromirror of the DMD. This enables focus control for each region on the substrate exposed to a light flux reflected by one mirror of the DMD, and thus improves accuracy of the focus control.

When the plurality of light receiving portions individually detect the light amount, it may take some time to perform focus control. Therefore, if, in an exposure region corresponding to one micromirror of the DMD, the changing amount of the surface shape of the substrate PL is sufficiently small, the light receiving element LR1a may include only one light receiving portion. This further reduces the time required for focus control.

In the present embodiment, another beam splitter BS1b is disposed between the pinhole member PH1 and the optical system PO3. A light flux reflected by the beam splitter BS1b is imaged on a light receiving element LR1b by an imaging lens L1b. On the basis of the light amount detected by the light receiving element LR1b, the reference value for the light amount detected by the light receiving element LR1a is corrected in accordance with changes in the surface reflectivity of the substrate PL.

The correction of the reference value for the light amount detected by the light receiving element LR1a will now be described in detail. For example, since various resist materials can be applied to the substrate PL, the surface reflectivity of the substrate PL changes depending on the type of resist material applied. When the surface reflectivity of the substrate PL changes, the maximum light amount detected by the light receiving element LR1a in the in-focus state also changes. In the present embodiment, as described above, focus control is performed by using the maximum light amount detected by the light receiving element LR1a as a reference value. Therefore, the reference value needs to be changed in accordance with changes in the surface reflectivity of the substrate PL.

The light flux reflected by the substrate PL reaches the light receiving element LR1b without passing through the pinhole member PH1. Therefore, the light amount detected by the light receiving element LR1b scarcely changes regardless of the surface reflectivity of the substrate PL. That is, by using the light amount detected by the light receiving element LR1b to normalize the light amount detected by the light receiving element LR1a, the accuracy of focus control is maintained even when the surface reflectivity of the substrate PL changes. For example, a detection value of the light receiving element LR1a can be normalized by using a ratio between the light amount detected by the light receiving element LR1a and the light amount detected by the light receiving element LR1b.

Second Embodiment

Figure 2:
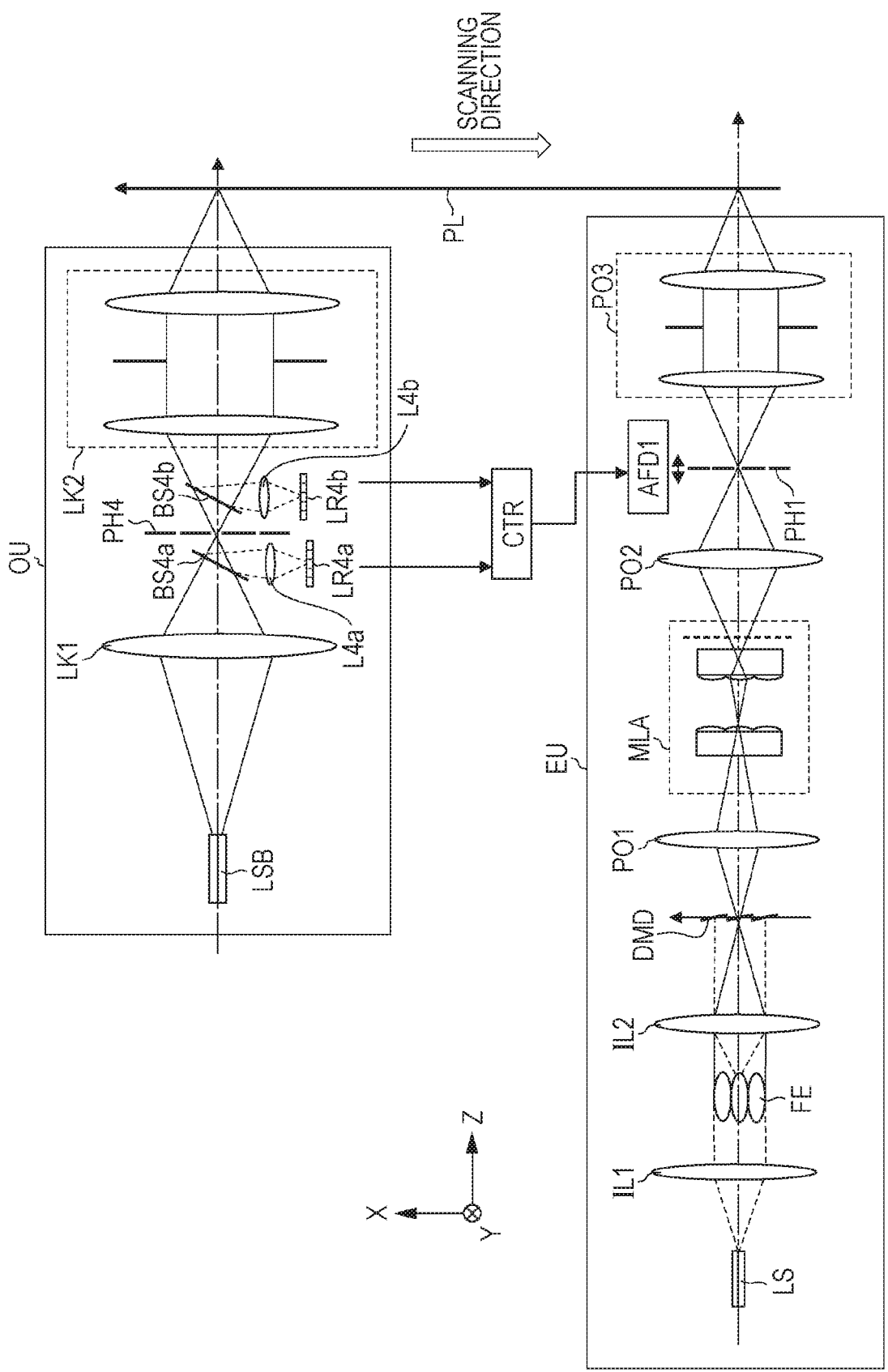
FIG. 2 is a diagram illustrating a configuration of optical systems according to a second embodiment.

With reference to FIG. 2, an exposure apparatus according to a second embodiment of the present invention will be described. In the present embodiment, an optical unit OU is provided, separately from an exposure unit EU including the illumination optical system IL and the projection optical system PO. The optical unit OU is for detecting a defocus amount representing a positional deviation between the condensed position of spot light and the surface of the substrate PL. The configuration of the exposure unit EU will not be described here, as it is the same as the configuration described in the previous embodiment.

The optical unit OU includes a light source LSB, an imaging optical system LK1, a pinhole member PH4 serving as a second light shielding member, and an imaging optical system LK2. A light flux emitted from the light source LSB is condensed by the imaging optical system LK1 onto the pinhole member PH4, and condensed by the imaging optical system LK2 at a position A on the substrate PL.

A beam splitter BS4a is disposed between the imaging optical system LK1 and the pinhole member PH4. A light flux reflected by the beam splitter BS4a is condensed onto a light receiving element LR4a by an imaging lens L4a.

The pinhole member PH4 is disposed such that when defocus occurs, the light amount detected by the light receiving element LR4a decreases. In the present embodiment, a defocus amount is detected by the same method as that for detecting a defocus amount in the first embodiment. Information about a defocus amount detected by the optical unit OU is transmitted to the control unit CTR. On the basis of the information received, the control unit CTR transmits to the actuator AFD1 a driving signal for driving the pinhole member PH1, which is included in the exposure unit EU and serves as a first light shielding member. The actuator AFD1 performs focus control by moving the pinhole member PH1 on the basis of the driving signal received.

In the present embodiment, the optical unit OU for detecting a defocus amount is provided separately from the exposure unit EU for performing focus control. This enhances throughput of exposure processing.

With reference to FIG. 2, an example will be described, where the substrate PL is subjected to scanning exposure in the direction from the positive to negative sides of the X-axis. An exposure region on the substrate PL first passes through a projection region of the optical unit OU, and then passes through a projection region of the exposure unit EU. That is, exposure processing is performed by the exposure unit EU after focus control is performed on the basis of a defocus amount detected at the time of passing through the projection region of the optical unit OU. Since scanning exposure can be performed without stopping the substrate PL for focus control, it is possible to improve both focus accuracy and throughput.

Third Embodiment

Figure 3:
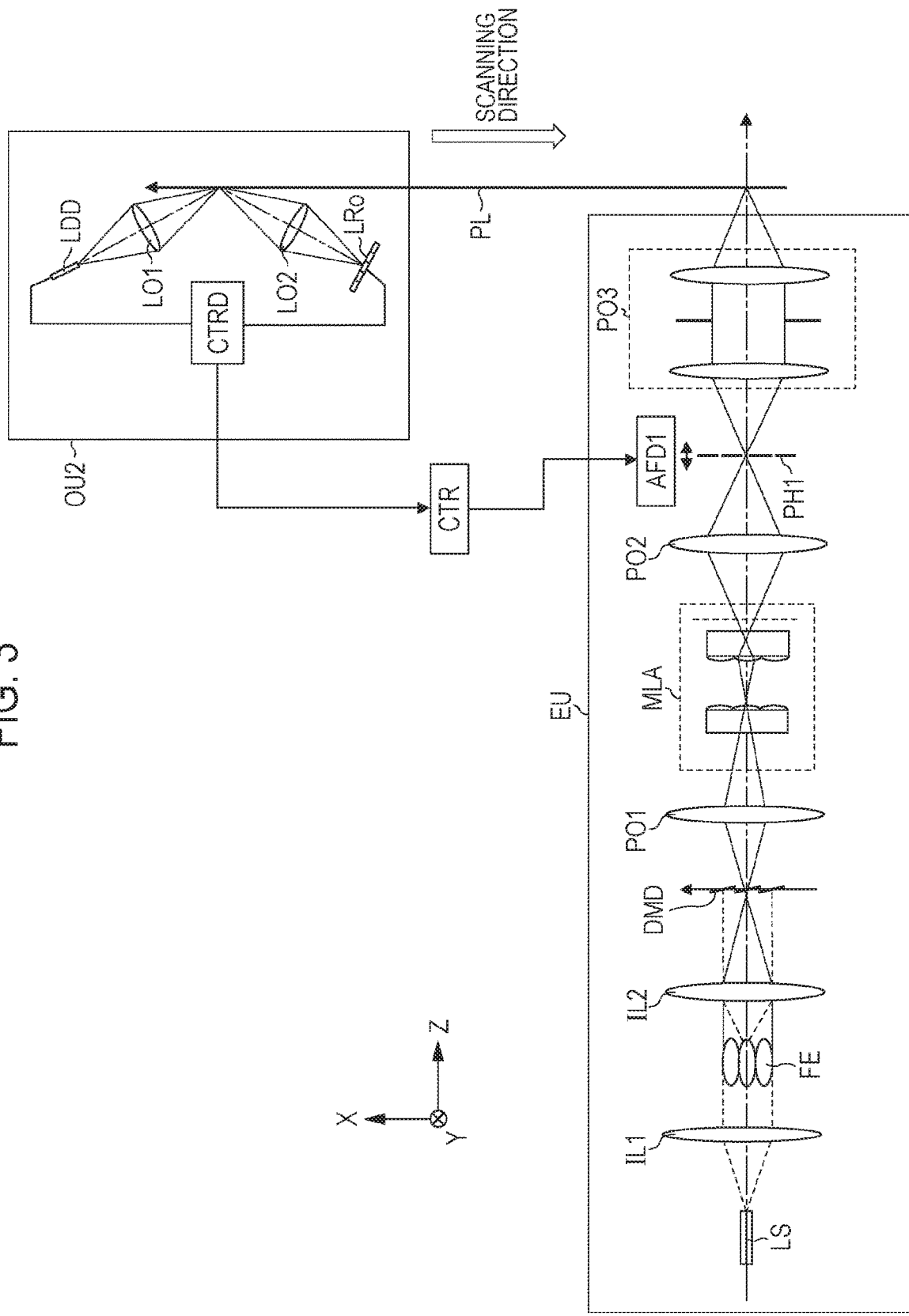
FIG. 3 is a diagram illustrating a configuration of optical systems according to a third embodiment.

With reference to FIG. 3, an exposure apparatus according to a third embodiment of the present invention will be described. In the present embodiment, an optical unit OU2 is provided, separately from the exposure unit EU including the illumination optical system IL and the projection optical system PO. The optical unit OU2 is for detecting a defocus amount representing a positional deviation between the condensed position of spot light and the surface of the substrate PL. The configuration of the exposure unit EU will not be described here, as it is the same as the configuration described in the previous embodiments.

The present embodiment differs from the second embodiment in the method of defocus detection in the optical unit OU2. In the optical unit OU2 of the present embodiment, a light flux obliquely enters the substrate PL, and defocus detection is performed on the basis of a signal obtained by condensing the light flux reflected by the substrate PL onto a light receiving element LRo.

A light flux emitted from a light source LDD is condensed by an imaging lens LO1 onto the substrate PL, and the light flux reflected by the substrate PL is condensed by an imaging lens LO2 onto the light receiving element LRo. If defocus occurs, the condensed position on the light receiving element LRo deviates. A focus control unit CTRD determines the defocus amount on the basis of the deviation amount of the condensed position on the light receiving element LRo.

Information about the defocus amount detected by the optical unit OU2 is transmitted to the control unit CTR. On the basis of the information received, the control unit CTR transmits to the actuator AFD1 a driving signal for driving the pinhole member PH1 included in the exposure unit EU. The actuator AFD1 performs focus control by moving the pinhole member PH1 on the basis of the driving signal received.

In the present embodiment, the optical unit OU2 for detecting a defocus amount is provided separately from the exposure unit EU for performing focus control. This enhances throughput of exposure processing. In the present embodiment, as in the second embodiment, scanning exposure can be performed without stopping the substrate PL for focus control. It is thus possible to improve both focus accuracy and throughput.

(Overview of Scanning Exposure)

Figure 4:
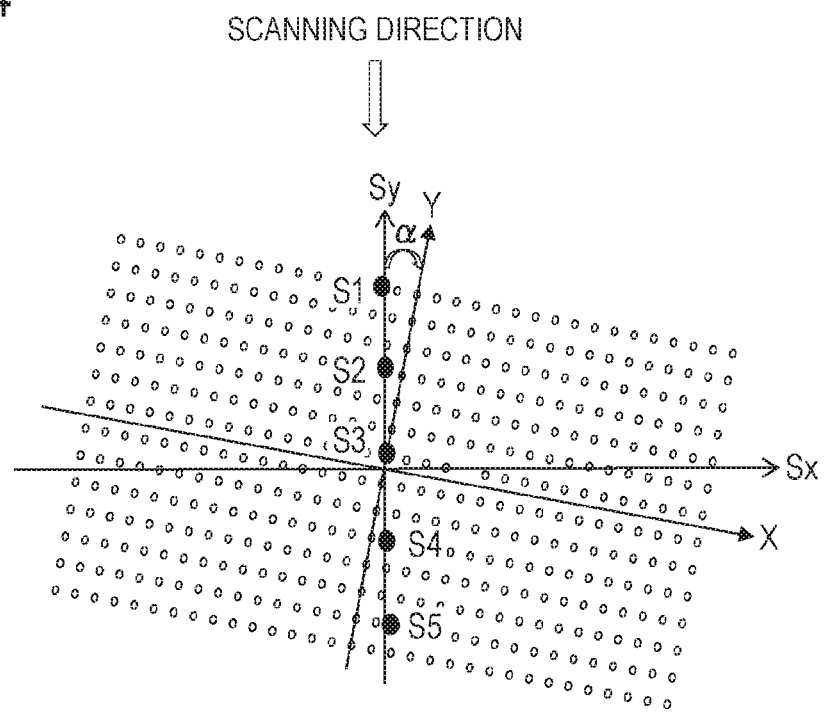
FIG. 4 is a diagram illustrating an overview of scanning exposure on a substrate according to the present invention.

FIG. 4 is a diagram illustrating an overview of scanning exposure on the substrate. The DMD includes a plurality of micromirrors arranged in the XY plane. Each point in FIG. 4 represents a spot light formed by a micromirror of the DMD.

Sx and Sy in FIG. 4 represent a scanning direction of the substrate PL during scanning exposure. The direction of the array of spot lights is tilted by an angle of a with respect to the scanning direction of the substrate PL. This configuration enables uniform exposure of the substrate PL. When the substrate is scanned in the Sy-direction, a region located at Sx=0 in the Sx-Sy coordinate system is intermittently exposed multiple times, as indicated by black dots in FIG. 4. FIG. 4 illustrates how a specific exposure region on the substrate PL is exposed sequentially to spot lights S1, S2, S3, S4, and S5.

The focus control described above is performed on the basis of the light amount detected by the light receiving element at the time of each exposure. Focus control for exposure to spot light $S_{n+1}$ may be performed on the basis of the light amount detected by the light receiving element at irradiation with specific spot light $S_n$. Alternatively, focus control may be performed on the basis of the light amount detected by the light receiving element at irradiation with a plurality of spot lights.

For example, focus control for exposure to spot light $S_{n+100}$ may be performed on the basis of the light amount detected by the light receiving element at irradiation with each of spot lights $S_n$ to $S_{n+99}$.

Figure 5:
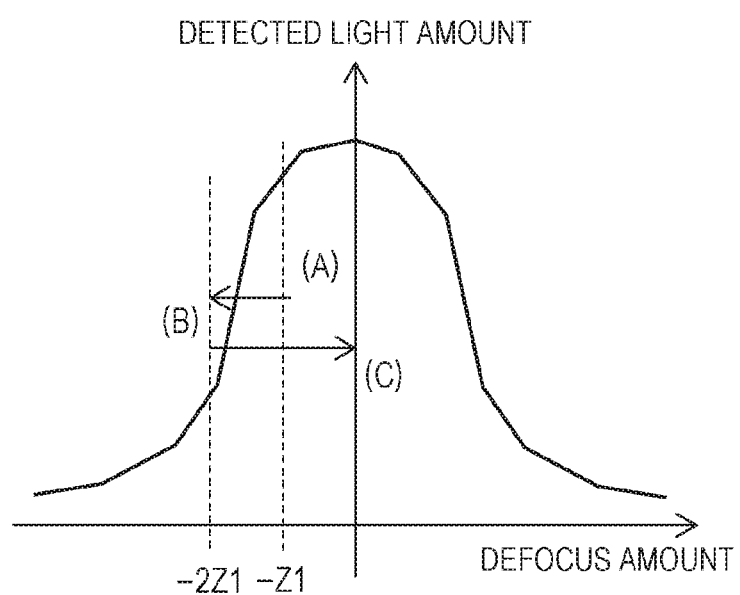
FIG. 5 is a diagram illustrating a relation between a defocus amount and the light amount detected by a light receiving element (or detected light amount).

With reference to FIG. 5, a focus control method in scanning exposure for a specific region on the substrate will be described. In FIG. 5, the horizontal axis represents a defocus amount representing a positional deviation between the condensed position of spot light and the substrate surface, and the vertical axis represents the light amount detected by the light receiving element. The focus control method in the exposure apparatus according to the first embodiment will be described.

Referring to FIG. 5, (A) represents the light amount detected by the light receiving element at the start of focus control and the defocus amount at the start of focus control. At the stage of (A), where the direction of positional deviation between the condensed position of spot light and the substrate surface is unknown, the pinhole member PH1 is driven either toward the light source LS or toward the substrate PL. For example, when the pinhole member PH1 is moved such that the defocus amount increases by Z1 in the negative direction, the light amount detected by the light receiving element decreases as in (B). At this point, the relation between the moving direction of the pinhole member PH1 and the increase/decrease in the light amount detected by the light receiving element is identified. Therefore, in (C), the pinhole member PH1 is moved in the direction opposite the direction from (A) to (B) in which the pinhole member PH1 is driven. The pinhole member PH1 is driven such that the moving amount of the pinhole member PH1 from (B) to (C) is twice the moving amount of the pinhole member PH1 from (A) to (B).

By thus appropriately setting the driving direction of the pinhole member PH1, high-speed focus control is achieved.

As illustrated in FIG. 5, at the start of focus control, the relation between the driving direction of the pinhole member and the increase/decrease in defocus is unknown. At the start of focus control, therefore, the pinhole member may be moved in the direction in which the defocus amount increases. As illustrated in FIG. 4, however, the maskless exposure apparatus performs multiple exposure which exposes a specific exposure region on the substrate to spot light multiple times. Therefore, even when the defocus amount is increased by focus control at the start, this only affects the accuracy of focus control for exposure in the initial stage, and is less likely to affect the accuracy of pattern formation on the substrate.

Figure 6:
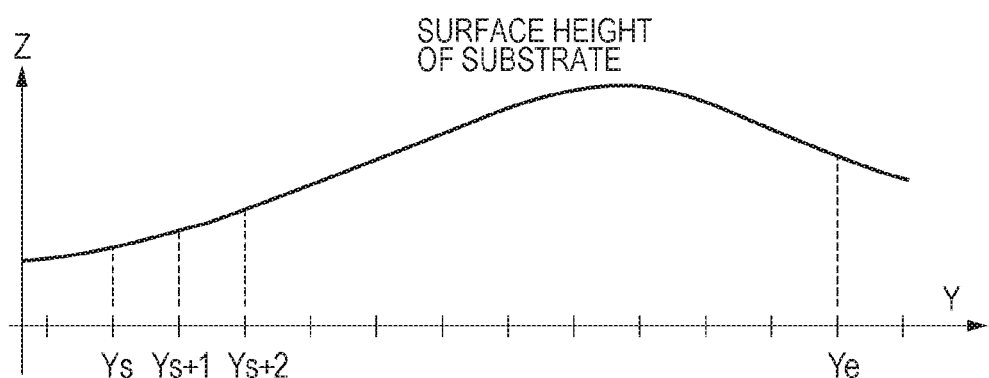
FIG. 6 is a diagram illustrating how the surface height of the substrate changes.

As illustrated in FIG. 6, the actual surface height of the substrate PL often gradually changes. FIG. 6 illustrates how the surface height of the substrate PL changes along the Y-axis direction. For example, a region at position Ys in the Y-axis direction is subjected to sequential scanning exposure to the spot lights S1, S2, S3, S4, and S5 illustrated in FIG. 4. In other words, for example, as for the spot light S1, the regions at Ys, Ys+1, Ys+2, . . . , and Ye are sequentially exposed to the spot light S1.

A high-accuracy exposure operation requires focus control that reduces the defocus amount in accordance with changes in the surface height of the substrate. As described with reference to FIG. 5, however, the direction in which to drive the pinhole member PH1 for reducing the defocus amount is yet to be determined at the start of scanning exposure.

In the period immediately after the start of scanning exposure, therefore, the exposure operation may be performed with an insufficient focus accuracy. In the example of FIG. 6, the focus accuracy for exposure to the spot light S1 at the position Ys may be insufficient. As illustrated in FIG. 5, however, the focus accuracy can be improved by continuous execution of focus control.

Specifically, focus accuracy for exposure to the spot light S2 may be lower than focus accuracy for exposure to the spot light S1. However, it is possible to make focus accuracy for exposure to the spot light S3 higher than the focus accuracy for exposure to the spot light S1 or S2.

Thus, by performing multiple exposure which exposes a specific region on the substrate PL to spot light multiple times, pattern formation can be done with high accuracy. This is because the amount of exposures performed with insufficient focus accuracy constitutes only a small percentage of the total amount of the multiple exposure.

(Modifications)

In the embodiments described above, the pinhole member PH1 formed of a single component is moved for focus control. However, the pinhole member PH1 may be formed of a plurality of components capable of being individually driven. For example, a plurality of components having openings may be provided, and some components corresponding to regions on the substrate PL may be moved for focus control, so that focus accuracy is enhanced.

The present invention provides an exposure apparatus that is capable of performing focus control on a substrate at high speed.

(Article Manufacturing Method)

An article manufacturing method according to an embodiment of the present invention is suitable for use in manufacturing an article, such as a microdevice (e.g., semiconductor device) or an element having a microstructure. The article manufacturing method of the present embodiment includes a step (substrate exposing step) of forming a latent image pattern, by using the exposure apparatus described above, on a photoresist applied to a substrate, and a step of developing the latent image pattern formed on the substrate in the substrate exposing step. This manufacturing method further includes known steps (e.g., oxidation, film deposition, vapor deposition, doping, planarization, etching, resist removing, dicing, bonding, and packaging). The article manufacturing method according to the present embodiment is advantageous over conventional methods, in terms of at least one of performance, quality, productivity, or production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus comprising:
   a projection optical system configured to project, onto a substrate, exposure light for forming a pattern on the substrate;
   a light shielding member having an opening for allowing the exposure light to pass therethrough;
   a first image sensor configured to receive a light flux passing through the opening in the light shielding member after being reflected by the substrate;
   a second image sensor configured to receive a light flux passing through the opening in the light shielding member; and
   a control unit configured to detect a defocus amount representing a positional deviation between a condensed position of the exposure light and the substrate, and configured to move the light shielding member in a direction of an optical axis of the projection optical system on the basis of the defocus amount,
   wherein the control unit detects the defocus amount on the basis of the amount of light received by the first image sensor and the second image sensor.

2. The exposure apparatus according to claim 1, wherein the control unit moves the light shielding member in such a manner as to increase the amount of light received by the first image sensor.

3. The exposure apparatus according to claim 1, wherein the light shielding member is disposed in an optical path of the projection optical system.

4. The exposure apparatus according to claim 1, wherein the light shielding member is disposed in a plane that is optically conjugate to the substrate in an in-focus state where the defocus amount is smaller than a predetermined amount.

5. The exposure apparatus according to claim 1, wherein the light shielding member is made of metal.

6. The exposure apparatus according to claim 1, further comprising:
   an optical modulation unit including a plurality of optical modulation elements; and
   an illumination optical system configured to irradiates the optical modulation unit with light,
   wherein light reflected by the optical modulation unit enters the projection optical system.

7. The exposure apparatus according to claim 6,
   wherein under focus control for changing a defocus amount representing a positional deviation between the condensed position of the exposure light and the substrate, an exposure operation that projects spot light through the projection optical system onto the substrate is performed, the spot light being formed by the illumination optical system, and
   wherein the exposure operation is repeated for a specific region on the substrate.

8. An article manufacturing method comprising:
   a step of exposing a substrate by using the exposure apparatus according to claim 1; and
   a step of developing the substrate exposed in the exposing step.

9. The exposure apparatus according to claim 1, wherein the second image sensor receives the light flux after having been reflected by the substrate and before arriving at the opening in the light shielding member.

10. The exposure apparatus according to claim 1, wherein the second image sensor receives the light flux before arriving at the substrate.

11. The exposure apparatus according to claim 1, wherein the control unit corrects a reference value of the amount of light received by the first image sensor on the basis of the amount of light received by the second image sensor.

12. The exposure apparatus according to claim 1, wherein the control unit detects the defocus amount on the basis of a ratio between the amount of light received by the first image sensor and the amount of light received by the second image sensor.

* * * * *